(12) United States Patent
Castagna et al.

(10) Patent No.: US 11,725,990 B2
(45) Date of Patent: Aug. 15, 2023

(54) THERMOGRAPHIC SENSOR WITH THERMO-COUPLES ON A SUSPENDED GRID AND PROCESSING CIRCUITS IN FRAMES THEREOF

(71) Applicant: STMICROELECTRONICS S.r.l., Agrate Brianza (IT)

(72) Inventors: Maria Eloisa Castagna, Catania (IT); Giuseppe Bruno, Paterno' (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/537,086

(22) Filed: Nov. 29, 2021

(65) Prior Publication Data

US 2022/0170794 A1 Jun. 2, 2022

(30) Foreign Application Priority Data

Nov. 30, 2020 (IT) .................. 102020000029138

(51) Int. Cl.
*G01J 5/16* (2006.01)
*G01J 5/20* (2006.01)
(Continued)

(52) U.S. Cl.
CPC . *G01J 5/16* (2013.01); *G01J 5/20* (2013.01); *H01L 27/14669* (2013.01); *H04N 5/33* (2013.01); *G01J 2005/0077* (2013.01)

(58) Field of Classification Search
CPC ........ G01J 5/16; G01J 5/20; G01J 2005/0077; G01J 5/024; G01J 5/045; G01J 5/12; H01L 27/14669; H10N 19/00; H10N 10/17
See application file for complete search history.

(56) References Cited

U.S. PATENT DOCUMENTS 7,489,024 B2 * 2/2009 Socher ............... G02B 26/0841
257/706
2006/0244067 A1 11/2006 Socher et al.
(Continued)

OTHER PUBLICATIONS

Avraham et al., "Modeling the thermal performance of a packaged MEMS thermal sensor at wide pressure range for IoT applications," IEEE International Conference on Microwaves, Communications, Antennas and Electronics Systems (COMCAS), Tel-Aviv, Israel, Nov. 4-6, 2019, 4 pages.

(Continued)

*Primary Examiner* — David P Porta
*Assistant Examiner* — Meenakshi S Sahu
(74) *Attorney, Agent, or Firm* — Seed Intellectual Property Law Group LLP

(57) ABSTRACT

A thermographic sensor is proposed. The thermographic sensor includes a plurality of sensing elements each comprising at least one thermo-couple. The thermographic sensor is integrated on a semiconductor on insulator body that is patterned to define a grid suspended from a substrate; for each sensing element, the grid has a frame with the cold joint of the thermo-couple, a plate with the hot joint of the thermo-couple and one or more arms sustaining the plate from the frame. The frames include one or more conductive layers of thermally conductive material for thermally equalizing the cold joints with the substrate. Moreover, each sensing element may also include a processing circuit for the thermo-couple that is integrated on the corresponding frame. A thermographic device including the thermographic sensor and a corresponding signal processing circuit, and a system including one or more thermographic devices are also proposed.

20 Claims, 6 Drawing Sheets

(51) Int. Cl.
H01L 27/146 (2006.01)
H04N 5/33 (2023.01)
G01J 5/00 (2022.01)

(56) References Cited

U.S. PATENT DOCUMENTS

2014/0036953 A1 2/2014 Kimura et al.
2017/0221959 A1 8/2017 Udrea et al.
2022/0170795 A1* 6/2022 Bruno .................. G01J 5/24

OTHER PUBLICATIONS

Fedirko, V.A. et al., "Thermopile IR Sensor Arrays," Proceedings of the Scientific-Practical Conference, Research and Development, 2016, pp. 39-48.
Hamamatsu Photonics, Thermopile Detector, www.hamamatsu.com, 2012, pp. 1-9.
Hopper, R. et al., "A CMOS-Based Thermopile Array Fabricated on a Single $SiO_2$ Membrane," *Proceedings* 2(13):878, 2018, 4 pages.
Goren et al., "CMOS-SOI-MEMS Transistor (TeraMOS) for Terahertz Imaging," IEEE International Conference on Microwaves, Communications, Antennas and Electronics Systems (COMCAS), Nov. 9-11, 2009, Tel-Aviv, Israel, 17 pages.
Nemirovsky, Y., "CMOS-SOI-MEMS," URL=https://yaelnemirovsky.net.technion.ac.il/sample-page/cmos-soi-mems/, download date Sep. 23, 2021, 2 pages.
Panasonic (PAISEU) "Grideye Sensor," PowerPoint slide show, Jan. 6, 2017, 41 pages.
Zviagintsev, A. et al., "CMOS Disruptive Sensing Systems for Dual Applications," Israel Institute of Technology, Department of Electrical Engineering, Jun. 2017, 1 page.
Zviagintsev, T. et al., "Micro-machined C 1OS-SOT transistor (TMOS) thermal sensor operating in air," International Conference on Microwaves, Antennas, Communications and Electronic Systems, Tel-Aviv, Israel, Nov. 13-15, 2017, 4 pages.

* cited by examiner

THERMOGRAPHIC SENSOR WITH THERMO-COUPLES ON A SUSPENDED GRID AND PROCESSING CIRCUITS IN FRAMES THEREOF

BACKGROUND

Technical Field

The present disclosure relates to the thermographic field. More specifically, this disclosure relates to thermographic sensors.

Description of the Related Art

The background of the present disclosure is hereinafter introduced with the discussion of techniques relating to its context. However, even when this discussion refers to documents, acts, artifacts and the like, it does not suggest or represent that the discussed techniques are part of the prior art or are common general knowledge in the field relevant to the present disclosure.

Thermographic sensors are commonly used to detect thermal characteristics of their fields of view (each comprising one or more material objects). For example, the thermographic sensors are capable of sensing thermal radiations (i.e., electromagnetic radiations generated by thermal motion of their particles), which are emitted by every (material) objects with a temperature above absolute zero; since the objects behave substantially as black bodies (i.e., with the emitted thermal radiations only depending on the corresponding temperatures), the thermal radiations that are sensed then represents their temperatures. For example, the thermographic sensors are used to measure the temperatures of objects taking the whole field of view (such as in thermo-scanners). Alternatively, the thermographic sensors are used to acquire thermographic images (or thermograms) each representing a distribution of the temperature of the field of view (as defined by the thermal radiations that are emitted from its different locations); the thermographic images are used in thermal imaging (or thermography) applications to represent any field of view (in terms of thermal characteristics thereof) independently of its illumination, i.e., even when it is not visible to human eye.

Several types of thermographic sensors are available. For example, thermographic sensors of uncooled type (also known as thermal sensors) sense changes in an electrical parameter depending on changes in their temperature related to the amount of thermal radiation that is absorbed; these thermographic sensors may operate at room temperature, without requiring any complex and expensive cooling equipment.

A typical (uncooled) thermographic sensor is based on thermo-piles (TPs). A thermo-pile is formed by a plurality of thermo-couples that are connected to each other, generally in series. Each thermo-couple converts a temperature gradient between a hot and a cold junction (generated by the thermal radiation) into electrical energy (measuring its amplitude) according to the Seebeck effect. For example, the thermo-couple comprises two (electric) conductors of different materials (having different Seebeck coefficients). The conductors are joined at a point whose temperature has to be measured (hot junction or joint), whereas their free ends are maintained at a reference temperature (cold junction or joint). When a temperature gradient exists between the hot joint and the cold joint, a corresponding voltage is generated at the cold joint, from which voltage the temperature gradient may be calculated (in case a very accurate measure is required, such as for the temperature of a human body, a real temperature at the cold joint may also be measured, for example, by a separate temperature sensor like based on a thermistor). The measured voltage is very small (of the order of $\mu V$); the connection in series of a number of thermo-couples in a thermo-pile then generates a higher (total) measured voltage providing a better resolution.

The thermographic sensor is generally integrated on a die of semiconductor material with a Micro Electro-Mechanical Systems (MEMS) technology. For example, for each thermo-couple a thermally insulated membrane is mechanically anchored to the substrate through a cantilever. To be thermally insulated, each membrane is singularly released from the substrate through a deep etching process typical of the MEMS technology; the thermo-couple is formed with its hot joint on the membrane and its cold joint on a bulk of the die (acting as a heat sink to its substrate that maintains a stable temperate and ensures a good thermal insulation between the hot joint and the cold joint). To enhance the sensor sensitivity, the thermographic sensor is then packaged (together with one or more other integrated circuits) in a vacuum-sealed structure preventing heat sink from atmosphere. However, this structure limits a miniaturization of the thermographic detector. Alternatively, a single suspended membrane may be provided in the die for all the thermo-couples; the thermo-couples are formed in this membrane with their cold joints close to tracks of (thermally) conductive material acting as heat sink to the substrate. However, this structure has a poor thermal insulation between the hot joints and the cold joints and is subject to thermal cross talk among the thermo-couples.

A completely different thermographic sensor is instead based on Thermally isolated MOS (TMOS) transistors (having electrical characteristics strongly depending on temperature). In this case, two arrays of TMOS transistors are provided: an array is exposed to the thermal radiation and another array is kept blind (for example, by shielding it with a metal layer). Each TMOS transistor provides a signal depending on its temperature (for example, a current when a working point thereof is set by a biasing voltage). A differential signal indicative of a temperature gradient between each pair of TMOS transistors in the exposed array and in the blind array may then be generated by subtracting their signals, from which differential signal the temperature gradient may be calculated (as above, in case a very accurate measure is required a real temperature at the TMOS transistor in the blind array may also be measured, for example, by a separate temperature sensor like based on a thermistor).

BRIEF SUMMARY

A simplified summary of the present disclosure is herein presented in order to provide a basic understanding thereof; however, the sole purpose of this summary is to introduce some concepts of the disclosure in a simplified form as a prelude to its following more detailed description, and it is not to be interpreted as an identification of its key elements nor as a delineation of its scope.

The present disclosure includes forming the thermo-couples being thermally insulted in a common suspended grid.

For example, an aspect provides a thermographic sensor. The thermographic sensor comprises a plurality of sensing elements each comprising at least one thermo-couple. The thermographic sensor is integrated on a semiconductor on insulator body that is patterned to define a grid suspended from a substrate; for each sensing element, the grid has a frame with the cold joint of the thermo-couple, a plate with the hot joint of the thermo-couple and one or more arms sustaining the plate from the frame. The frames comprise one or more conductive layers of thermally conductive material for thermally equalizing the cold joints with the substrate.

In an embodiment, each sensing element also comprises a processing circuit for the thermo-couple that is integrated on the corresponding frame.

A further aspect provides a thermographic device comprising this thermographic sensor and a corresponding signal processing circuit.

A further aspect provides a system comprising one or more thermographic devices as above.

BRIEF DESCRIPTION OF THE SEVERAL VIEWS OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes, like value, content and representation). In this respect, it is expressly intended that the drawings are not necessary drawn to scale (with some details that may be exaggerated and/or simplified) and that, unless otherwise indicated, they are merely used to illustrate the structures and procedures described herein conceptually. For example.

DETAILED DESCRIPTION

Figure 1:
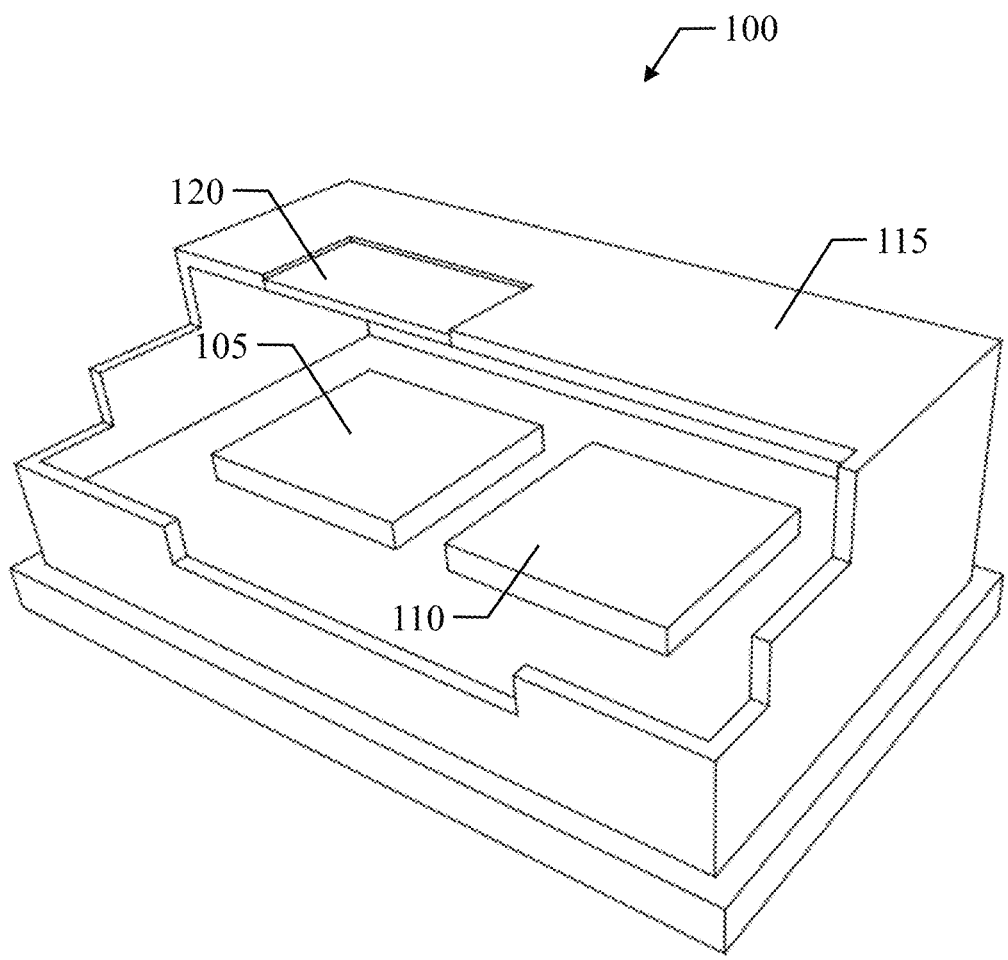
FIG. 1 shows a pictorial representation in partially cut-away view of a packaged thermographic device wherein the solution according to an embodiment of the present disclosure may be applied.

With reference to FIG. 1, a pictorial representation is shown in partially cut-away view of a (packaged) thermographic device 100 wherein the solution according to an embodiment of the present disclosure may be applied.

The thermographic device 100 is used to detect thermal characteristics of (material) objects comprised in its field of view (defined by a part of the world within a solid angle to which the thermographic device is sensitive); the thermographic device 100 may find application in different fields, for example, for medical, security, military, industrial and the like applications. The thermographic device 100 comprises the following components.

A thermographic sensor 105 of uncooled type is used to sense electromagnetic radiations that are emitted by every objects with a temperature above absolute zero (according to the black body radiation law). For example, the thermographic sensor 105 is sensitive to infrared (IR) radiations, with wavelengths in the (infrared) range from 1.1 μm to 20.0 μm, which infrared radiations are emitted from most of the objects near room temperature. The thermographic sensor 105 then outputs one or more temperature (electrical) signals indicative of the infrared radiation that is sensed, and then of the corresponding temperature of the objects in the field of view; for example, the thermographic sensor 105 may output a single temperature signal or multiple temperature signals that represent a temperature gradient of the whole field of view or of different locations of the field of view, respectively, with respect to a reference (environment) temperature. A processing unit 110 is coupled with the thermographic sensor 105 for processing the temperature signals provided by the thermographic sensor 105, for example, by performing analog-to-digital conversion, temperature correction (such as by adding the environment temperature as measured by a separate temperature sensor, like based on a thermistor, in case a very accurate measure is required) and so on. The processing unit 110 outputs an indication of the temperature of the field of view or a (digital) thermographic image of the field of view (defined by a bitmap of (digital) values for basic picture elements (pixels) of the thermographic image, with each (pixel) value defining a brightness of the pixel as a function of the temperature of the corresponding location of the field of view). The thermographic sensor 105 and the processing unit 110 are enclosed in a package 115, which protects them at the same time allowing access thereto; for example, the package 115 (such as of ceramic type) shields the infrared radiations, with the exception of a window 120 provided with lens (such as of silicon) that concentrate the infrared radiations onto a (sensing) portion of the thermographic sensor 105.

Figure 2:
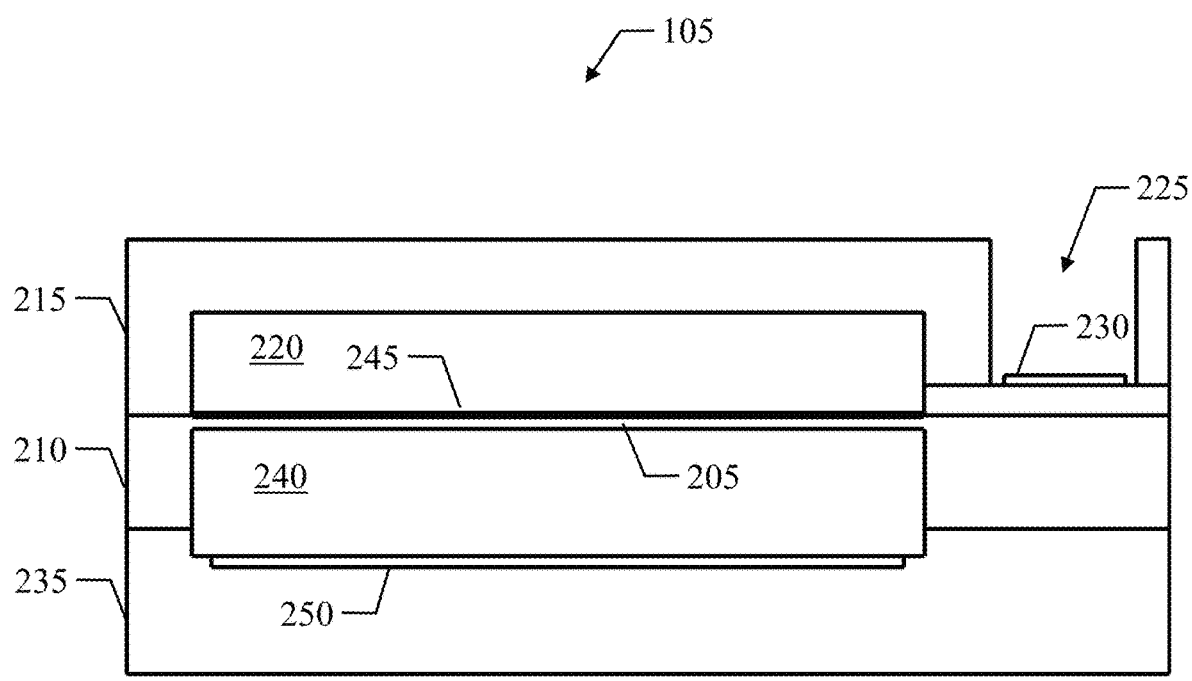
FIG. 2 shows a schematic cross-section view of a thermographic sensor according to an embodiment of the present disclosure.

With reference now to FIG. 2, a schematic cross-section view is shown of the thermographic sensor 105 according to an embodiment of the present disclosure.

The thermographic sensor 105 comprises an array of sensing elements 205 (for example, a starring array, i.e., a 2-dimensional array of 8×8 sensing elements 205). Each sensing element 205 provides a sensing (electrical) signal depending on its temperature. The sensing signals of all the sensing elements 205 may be combined into a (common) sensing signal representing the temperature gradient of the whole field of view, or they may be collected individually to represent the temperature gradient of the corresponding locations of the field of view.

The array of sensing elements 205 is integrated on a semiconductor on insulator body, such on a die 210 of SOI type manufactured with standard CMOS process steps with the addition of MEMS process steps, e.g., so as to define a corresponding chip. For example, as described in detail in the following, the array of sensing elements 205 is provided on a suspended membrane. For example, the suspended membrane may be released from a bulk of the die 210 or it may be released from a front of the die 210, such as by a wet etching process, without removing all the substrate.

Moreover, the thermographic sensor 105 comprises a (top) semiconductor body, such as a die 215 of silicon. A cavity 220 corresponding to the array of sensing elements 205 is formed (for example, by etching, in the die 215. Moreover, a window 225 is opened through the die 215, for example, by etching), so as to expose a lateral portion of the die 210 wherein I/O contacts 230, for example, pads, of the thermographic sensor 105 are provided. The thermographic sensor 105 further comprises a (bottom) semiconductor body, such as a die 235 of silicon. The die 215 and the die 235 are bonded to the die 210 with the cavity 220 facing the die 210, for example, with a glass frit technique via corresponding intermediate layers of glass, not shown in the figure, so as to encapsulate the array of sensing elements 205 in a vacuum-sealed structure defined by the cavity 220 and a cavity 240 of the die 210 corresponding to the sensing elements 205, where the sealed structure of the cavity 240 prevents heat sink from atmosphere and protects the sensing elements 205 mechanically. In some embodiments, the cavity 240 extends into the die 235.

The die 215 is substantially transparent to the infrared radiations. Therefore, the die 210 comprises an absorbing layer 245 in the released membrane at the cavity 220; the absorbing layer 245 is made of an infrared high-absorbance material, such as deposited TiN, so as to improve the absorption of the infrared radiations to be sensed by the (underling) sensing elements 205. In some embodiments, the die 235 comprises a vacuum getter 250 within the cavity 240. The vacuum getter 250 is made of a layer of a reactive material, such as a deposited alloy of Zirconium-Aluminum, capable of removing, e.g., chemically or by absorption, any residual molecules of gas present in the, e.g., vacuum-sealed, cavity 240.

Figure 3A:
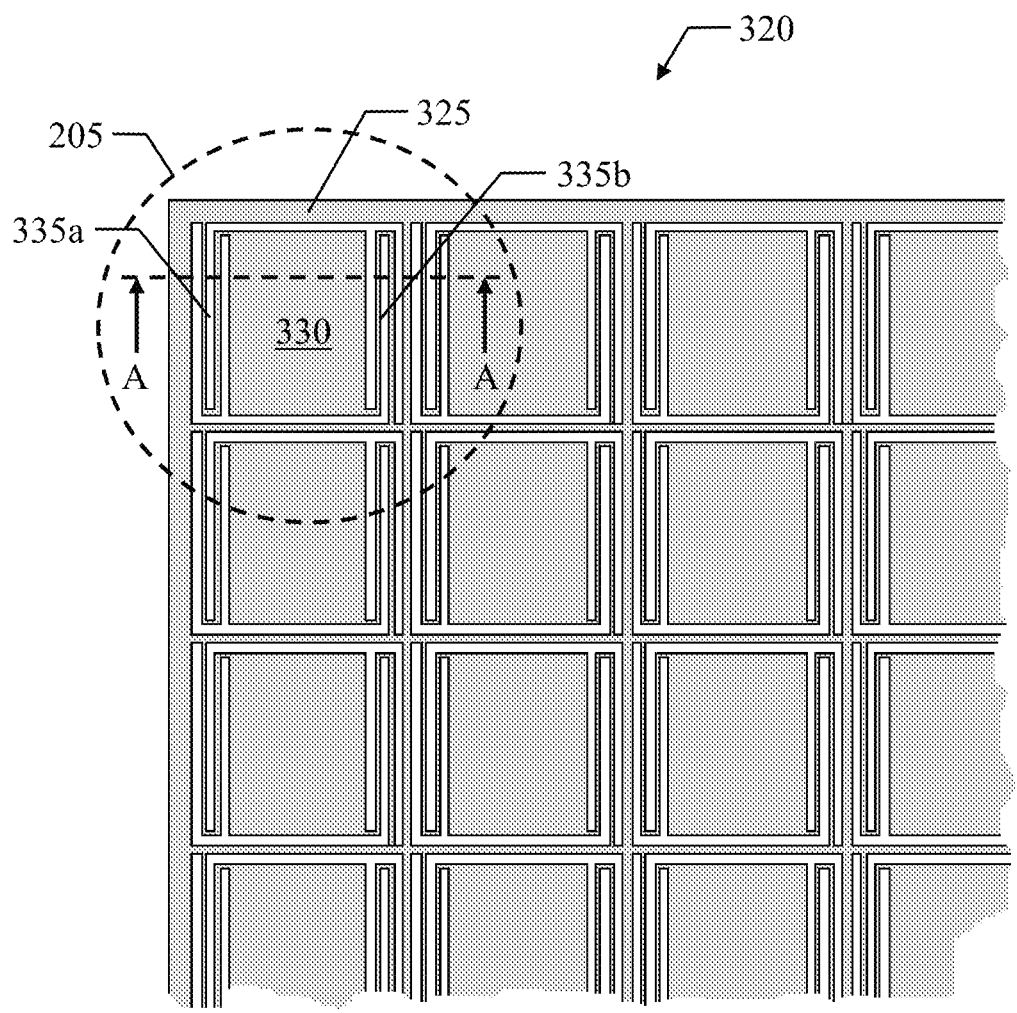
FIG. 3A-FIG. 3C show a schematic representation of a particular of the thermographic sensor according to an embodiment of the present disclosure.
Figure 3B:
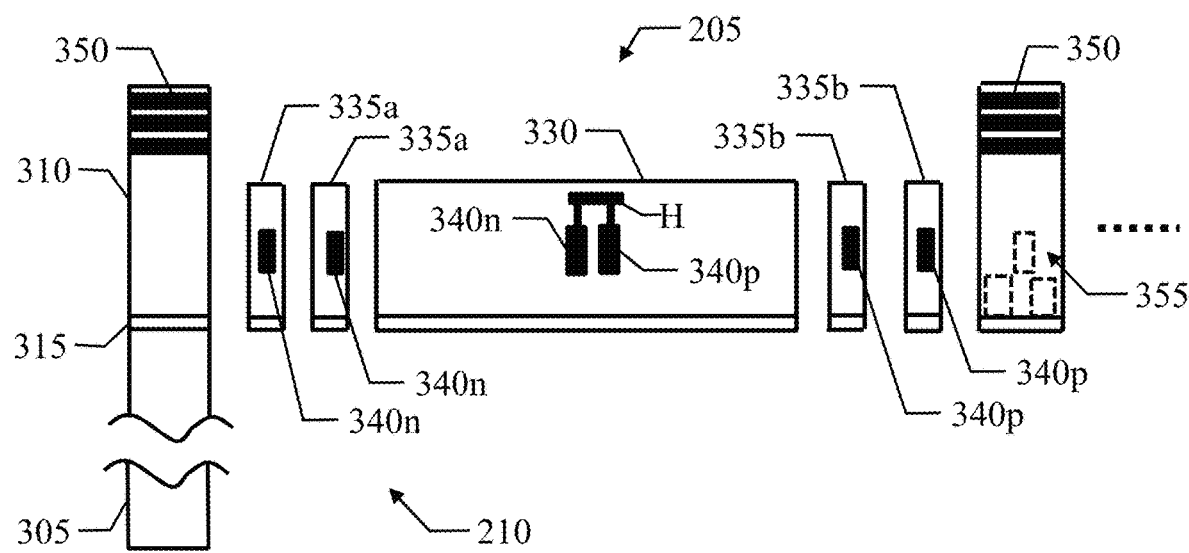
Figure 3C:
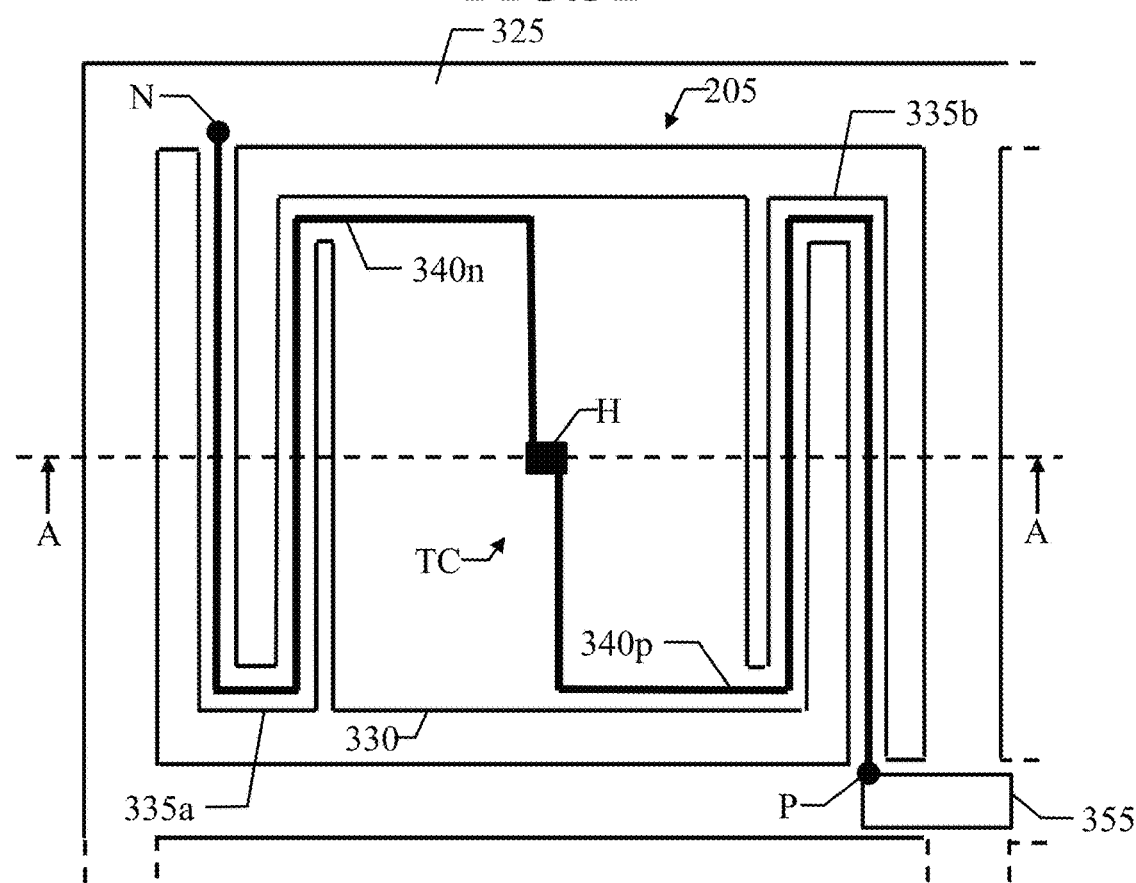

With reference now to FIG. 3A-FIG. 3C, a schematic representation is shown of an example of the thermographic sensor according to an embodiment of the present disclosure. FIG. 3A shows a top view of a portion of the array of sensing elements, FIG. 3B shows a cross-section view of a single sensing element 205 along the plane A-A of FIG. 3A-FIG. 3C and FIG. 3C shows the arrangement of a single sensing element 205 encircled in FIG. 3A.

The (SOI) die 210 has a layered structure comprising a substrate 305, such as of semiconductor material, like mono-crystal silicon; a functional layer 310, such as comprising an active layer of mono-crystal silicon, a layer of gate oxide, a layer of polysilicon, one or more layers of metal and one or more layers of insulating material, like silicon dioxide; and an, e.g., buried, insulating layer 315 of (electrically) insulating material (such as silicon oxide) that separate them. The die 210 is micro-machined to define the suspended membrane, e.g., of the functional layer 310 and the insulating layer 315, housing the array of sensing elements 205, where suspended membrane is released from the substrate 305. The suspended membrane is patterned to define a grid 320. The grid 320 is defined by regularly spaced row crosspieces and column crosspieces, which cross each other, e.g., perpendicularly, to form corresponding frames 325, e.g., surrounding holes, for the sensing elements 205. For each sensing element 205, the grid 320 then comprises a plate 330 that is suspended from the frame 325. For this purpose, one or more holding arms, two shown in the illustrated example denoted with the references 335a and 335b, sustain the plate 330 from the frame 325; the arms 335a, 335b are relatively long, for example, with a U-like shape, and thin.

Each sensing element 205 is based on a thermo-couple (or more) TC having a hot joint H arranged to receive the infrared radiation to be sensed, e.g., so as to be heated to a temperature depending thereon, and a cold joint P-N, with a positive terminal P and a negative terminal N, to be maintained at the environment temperature; in this way, the thermo-couple provides a sensing voltage depending on the difference between the temperature of the hot joint and the temperature of the cold joint. For this purpose, the hot joint H is formed in the plate 330 and the cold joint P-N is formed in the frame 325. For example, the thermo-couple TC comprises a (first) conductor 340p of an (electrically) conductive material and a (second) conductor 340n of another (electrically) conductive material, for example, P+ polysilicon and N+ polysilicon, respectively, which extend between the frame 325 and the plate 330 through the arms 335b and 335a, respectively. The ends of the conductors 340p and 340n in the plate 330, for example, at a center thereof, are shot-circuited, for example, through a track of metal, such as Aluminum, to define the hot joint H of the thermo-couple TC. The ends of the conductors 340p and 340n in the frame 325 define the positive terminal P and the negative terminal N, respectively, of the cold joint of the thermo-couple TC. Moreover, another thermo-couple (not shown in the figure) may be formed in a similar way by two regions of the mono-crystalline layer being doped with impurities of the P+ type and of the N+ type, which other thermo-couple is coupled in series to the thermo-couple TC into a thermo-pile. For the sake of simplicity, in the following reference will be made to the single thermo-couple TC, with the same considerations that apply to the thermo-pile as well. One or more conductive tracks 350 of a (thermally) conductive material, for example, three layers of metal such as Aluminum, extend along the frames 325 for thermally equalizing the cold joints P-N of the thermo-couples TC with the substrate 305, thereby acting as heat-sink elements therefor, and, in some implementations, for transmitting electrical signals.

The above-described structure provides a good thermal insulation between the plates 330 and the frames 325, e.g., a corresponding low thermal conduction coefficient Gth; in this way, it is possible to obtain a low thermal cross-talk among the sensing elements 205. Moreover, the dissipation of heat from the frames 325 to the substrate 305, e.g., in addition to its thermal insulation from the plates 330, makes it possible to obtain a good sensitivity of the thermo-couples TC.

This solution also significantly reduces a size of the thermographic sensor, thanks to the common cavity of all the sensing elements 205; this fosters the use of the corresponding thermographic detector in a number of fields, for example, in consumer applications, especially of mobile type.

In an embodiment, as described in detail in the following, each sensing element 205 further comprises a processing circuit 355 for the thermo-couple TC; the processing circuit 355 is integrated on the corresponding frame 325, for example, at an edge thereof.

For example, the processing circuit 355 is used to select the thermo-couple TC; this significantly simplifies a signal tracking.

In addition or in alternative, the processing circuit 355 is used to pre-amplify, e.g., locally, the sensing signal provided by the thermo-couple TC. This local pre-amplification, being performed on-board of the thermographic sensor, allows obtaining a higher amplification of the sensing signals and significantly increases a Signal-to-Noise Ratio (SNR) thereof.

In any case, the above-described solution further reduces a size of the thermographic sensor.

Figure 4:
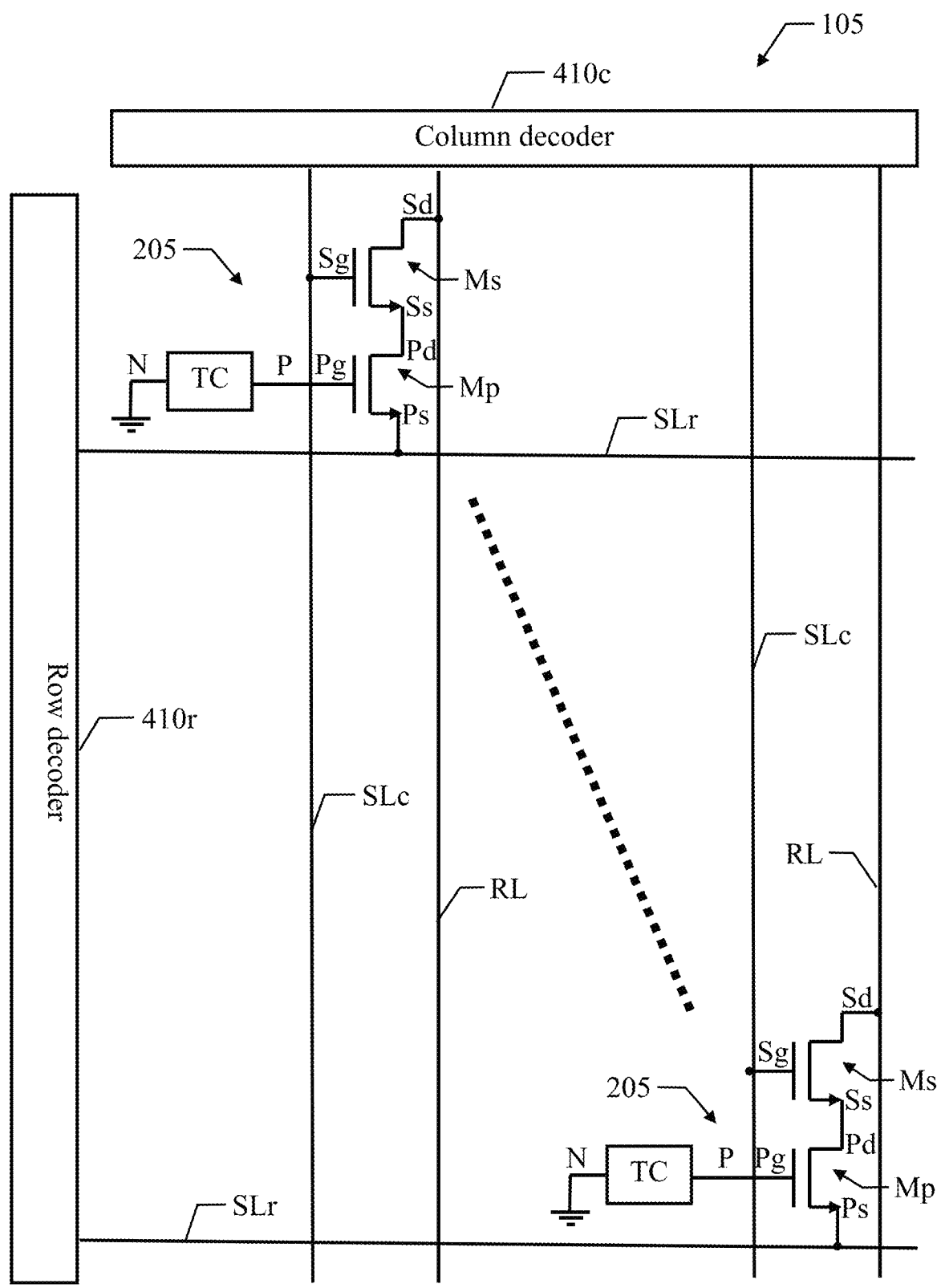
FIG. 4 shows a simplified circuital schema of the thermographic sensor according to an embodiment of the present disclosure.

With reference not to FIG. 4, a simplified circuital schema is shown of the thermographic sensor 105 according to an embodiment of the present disclosure.

In each sensing element 205, the negative terminal N of the thermo-couple TC is coupled with a reference (or ground) terminal that is biased to a reference (or ground) voltage in operation. The corresponding processing (selection/pre-amplification) circuit comprises a pre-amplification NMOS transistor Mp with gate terminal Pg, source terminal Ps and drain terminal Pd and a selection NMOS transistor Ms with gate terminal Sg, source terminal Ss and drain terminal Sd. The gate terminal Pg of the NMOS transistor Mp is coupled with the positive terminal P of the thermo-couple TC, and the drain terminal Pd of the NMOS transistor Mp is coupled with the source terminal Ss of the NMOS transistor Ps.

The thermographic sensor 105 has a selection row line SLr for each row of the array of sensing elements 205, and a selection column line SLc and a sensing line RL for each column of the array of sensing elements 205. Each (selection) row line SLr is coupled with the source terminal Ps of all the NMOS transistors Mp of the corresponding row. Each (selection) column line SLc is coupled with the gate terminal Sg of all the NMOS transistors Ms of the corresponding column. Each sensing line RL is coupled with the drain terminal Sd of all the NMOS transistors Ms of the corresponding column. A row decoder 410r drives all the row lines SLr, and a column decoder 410c drives all the column lines SLc and sensing lines RL.

In a rest condition, all the row lines SLr are biased to a high voltage and all the column lines SLc are biased to a low voltage so that all the transistors Mp, Ms are turned off and all the sensing lines RL are left floating. During a sensing operation, the sensing elements of the rows are selected in succession. For this purpose, the row line SLr of the selected row are biased to a low voltage and all the column lines Slc are biased to a high voltage so that the transistors Mp, Ms of it sensing elements 205 turn on, and all the sensing lines RL are coupled with corresponding sense amplifiers of the column decoder 410c. The sensing voltage provided by each thermo-couple TC of the selected row drives the corresponding NMOS transistor Mp at its gate terminal Pg; therefore, a (sensing) current corresponding to the sensing voltage, suitably amplified, flows through the NMOS transistor Mp and then, via the NMOS transistor Ms, through the corresponding sensing line RL. The sensing currents provided by all the sensing lines RL are converted into voltages, e.g., by the corresponding sense amplifiers, that are output by the thermographic sensor 105.

Figure 5:
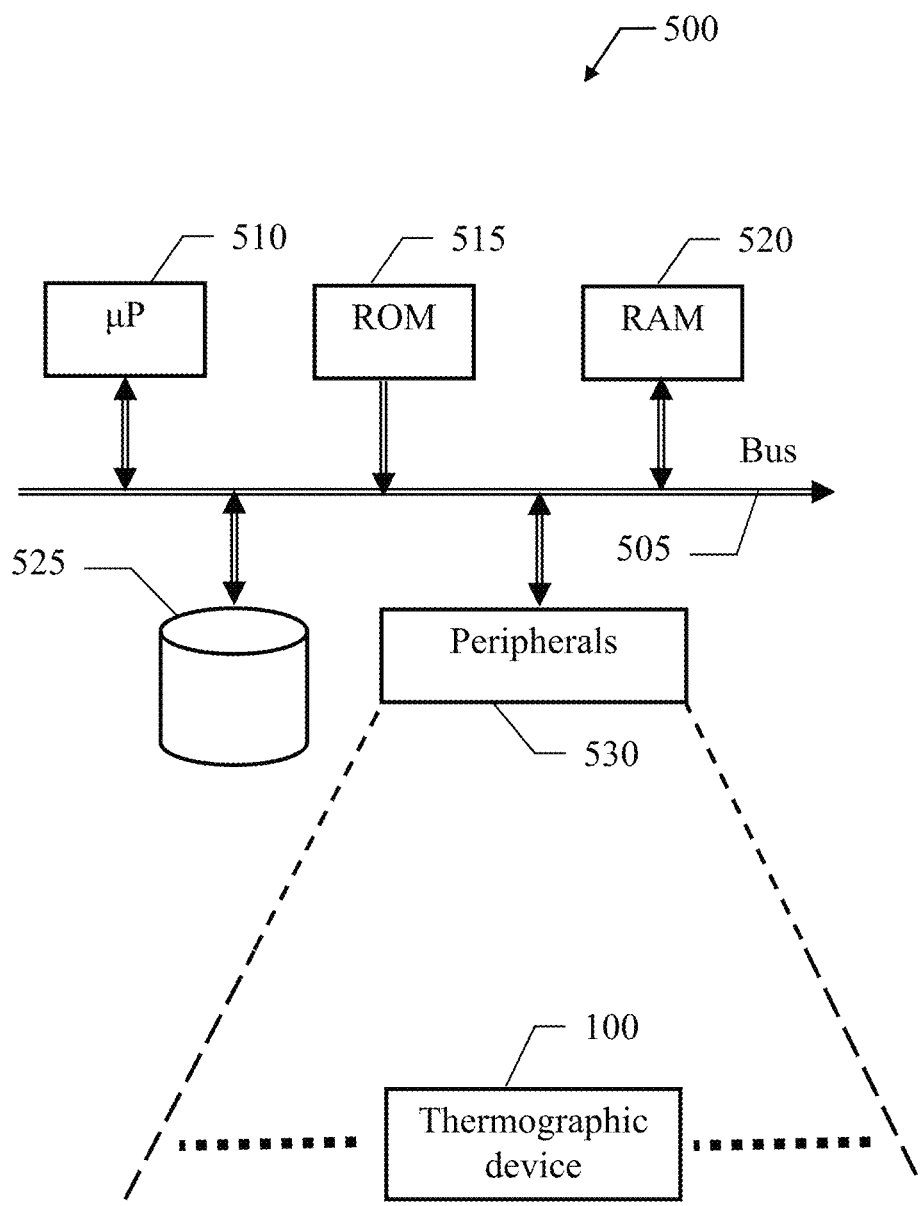
FIG. 5 shows a schematic block diagram of a system incorporating the thermographic device according to an embodiment of the present disclosure.

With reference now to FIG. 5, a schematic block diagram is shown of a system 500 incorporating the thermographic device 100 according to an embodiment of the present disclosure.

The system 500 (for example, a smart-phone) comprises several units that are connected among them through a bus structure 505 (with one or more levels). For example, a microprocessor (μP) 510, or more, provides a logic capability of the system 500; a non-volatile memory (ROM) 515 stores basic code for a bootstrap of the system 500 and a volatile memory (RAM) 520 is used as a working memory by the microprocessor 510. The system has a mass-memory 525 for storing programs and data, for example, a flash E²PROM. Moreover, the system 500 comprises a number of controllers of peripherals 530. For example, the peripherals 530 comprise a mobile telephone transceiver, a touch-screen, a microphone, a loudspeaker, a Wi-Fi WNIC, a Bluetooth transceiver, a GPS receiver, an accelerometer and so on; for example, the peripherals 530 comprise the above-described thermographic device 100, for example, implementing a thermographic camera.

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. For example, different embodiments of the present disclosure may be practiced even without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. Moreover, items presented in a same group and different embodiments, examples or alternatives are not to be construed as de facto equivalent to each other (but they are separate and autonomous entities). In any case, each numerical value should be read as modified according to applicable tolerances; for example, unless otherwise indicated, the terms "substantially," "about," "approximately" and the like should be understood as within 10%, preferably 5% and still more preferably 1%. Moreover, each range of numerical values should be intended as expressly specifying any possible number along the continuum within the range (comprising its end points). Ordinal or other qualifiers are merely used as labels to distinguish elements with the same name but do not by themselves connote any priority, precedence or order. The terms include, comprise, have, contain, involve and the like should be intended with an open, non-exhaustive meaning (i.e., not limited to the recited items), the terms based on, dependent on, according to, function of and the like should be intended as a non-exclusive relationship (i.e., with possible further variables involved), the term a/an should be intended as one or more items (unless expressly indicated otherwise), and the term means for (or any means-plus-function formulation) should be intended as any structure adapted or configured for carrying out the relevant function.

For example, an embodiment provides a thermographic sensor for sensing a thermal radiation. However, the thermographic sensor may be used for sensing any thermal radiation, for example, in the frequency range of infrared, terahertz, microwave and so on, for any purpose, for example, for measuring the temperature of objects, acquiring thermographic images, detecting presence of objects, detecting movements and so on.

In an embodiment, the thermographic sensor comprises a plurality of sensing elements. However, the sensing elements may be in any number and arranged in any way, for example, in a 2-D matrix, a linear vector and so on.

In an embodiment, each sensing element comprises at least one thermo-couple having a hot joint and a cold joint for providing a sensing voltage depending on a difference between a temperature of the hot joint and a temperature of the cold joint. However, the sensing element may comprise any number of thermo-couples, for example, a single one, multiple ones connected in series into a thermo-pile and so on, of any type, for example, polysilicon/polysilicon, polysilicon/metal, silicon/metal and so on.

In an embodiment, the thermographic sensor is integrated on a semiconductor on insulator body. However, the body may be of any type, for example, SOI, SOS and so on, and provided in any way, for example, packaged, in raw wafer form, as a bare die and so on. The thermographic sensor may be manufactured with any technologies, with masks being different in number and type, and with different process steps/parameters. Moreover, the above-described solution may be part of the design of an integrated device. The design may also be created in a hardware description language; moreover, if the designer does not manufacture chips or masks, the design may be transmitted by physical means to others.

In an embodiment, the semiconductor on insulator body comprises a substrate. However, the substrate may be of any type, for example, Silicon, Germanium, with any type and concentration of dopants, and so on.

In an embodiment, the semiconductor on insulator body comprises a functional layer. However, the functional layer may be of any type, either the same or different with respect to the substrate.

In an embodiment, the semiconductor on insulator body comprises an insulating layer interposed between the substrate and the functional layer. However, the insulating layer may be of any type, for example, silicon oxide, silicon nitride and so on.

In an embodiment, the body is patterned to define a grid, e.g., of the functional layer and the insulating layer, suspended from the substrate. However, the grid may have any shape, size and structure; this result may be achieved in any way, for example, with MEMS, NEMS, and the like process steps, applied after, before and/or during the integration of the sensing elements, and so on.

In an embodiment, for each of the sensing elements the grid comprises a frame, a plate and one or more arms sustaining the plate from the frame. However, the frames and the plates may be of any size and shape (for example, squared, rectangular and so on, either the same or different to each other), the arms may be in any number and in any position, for example, at the borders, the corners and so on of the plate, and they may have any length, width and shape, for example, U-like, S-like, straight and so on.

In an embodiment, the corresponding thermo-couple has a first conductor, e.g., of a first electrically conductive material, extending from a first terminal of the cold joint in the frame to the plate through one of the arms. However, the first conductor may be of any material, for example, deposited polysilicon/metal, implanted/diffused dopants, and it may extend in any way into the plate, for example, to the center, along one or more borders, and so on.

In an embodiment, the corresponding thermo-couple has a second conductor of a second electrically conductive material (different from the first electrically conductive material) extending from a second sensing terminal of the cold joint in the frame to the plate through one of the arms. However, the second conductor may be of any material and it may extend in any way into the plate, for example, either the same or different with respect to the first conductor, and through any arm, for example, the same of the first conductor or another one.

In an embodiment, the first conductor and the second conductor are short-circuited at the plate into the hot joint. However, the first conductor and the second conductor may be short-circuited at any position, for example, at the center, a corner, a border, and so on of the plate, and in any way, for example, via any connection element, such as of metal, polysilicon and the like, directly and so on.

In an embodiment, the frames comprise one or more conductive layers of thermally conductive material for thermally equalizing the cold joints with the substrate. However, the conductive layers may be in any number and of any type, for example, Aluminum, Copper and so on.

Further embodiments provide additional advantageous features, which may however be omitted at all in a basic implementation.

In an embodiment, each of the sensing elements comprises a processing circuit for the thermo-couple. However, the processing circuit may be of any type, for example, a pre-amplification circuit, a selection circuit, any combination thereof and so on.

In an embodiment, the processing circuit is integrated on the corresponding frame. However, the processing circuit may be integrated at any position in the frame, for example, at a corner, a side, any combination thereof and so on.

In an embodiment, the processing circuit comprises a pre-amplification circuit for pre-amplifying the sensing voltage provided by the thermo-couple. However, the pre-amplification circuit may be of any type, for example, based on any number and type of transistors, with or without additional components, and so on.

In an embodiment, the processing circuit comprises a selection circuit for selecting the thermo-couple. However, the selection circuit may be of any type, for example, based on any number and type of transistors, with or without additional components, and so on.

In an embodiment, for each sensing element the pre-amplification circuit comprises a pre-amplification transistor having a control terminal, a first conduction terminal and a second conduction terminal, e.g., the control terminal of the pre-amplification transistor being coupled with the first sensing terminal of the thermo-couple. However, the pre-amplification transistor may be of any type, for example, NMOS or PMOS with gate, source and drain terminals, NPN BJT or PNP BJT with base, emitter and collector terminals, and so on.

In an embodiment, for each sensing element the selection circuit comprises a selection transistor having a control terminal, a first conduction terminal and second conduction terminal, e.g., the first conduction terminal of the selection transistor being coupled with the second conduction terminal of the pre-amplification transistor. However, the selection transistor may be of any type, either the same or different with respect to the pre-amplification transistor.

In an embodiment, the sensing elements are arranged in an array with a plurality of rows and a plurality of columns. However, the array may have any number of rows and columns, being merely topological concepts that are not bound to any specific geometric arrangement.

In an embodiment, the thermographic sensor comprises corresponding column selection lines coupled with the control terminals of the selection transistors of the columns, corresponding row selection lines coupled with the first conduction terminals of the pre-amplification transistors of the rows, and corresponding sensing lines coupled with the second conduction terminals of the selection transistors of the columns. However, the row/column selection lines may be used to select the sensing elements in any way, for example, by rows/columns, individually, with any biasing voltages and so on, and the sensing lines may be used to sense the sensing voltages in any way, for example, with any sensing amplifiers, directly and so on. In any case, a different implementation is possible wherein the thermo-couples are connected in series (with or without the corresponding pre-amplification circuits) into a thermo-pile.

In an embodiment, the thermographic sensor comprises a first semiconductor body (having a cavity corresponding to a further cavity of the silicon on insulator body at the grid) and a second semiconductor body. However, the first/second semiconductor bodies may be of any type, for example, of the same or different semiconductor material with respect to the semiconductor on insulator body, and with cavities of any type, for example, the same as the grid, slightly smaller/ larger and so on; in any case, the possibility of using bodies of any other material is not excluded.

In an embodiment, the first semiconductor body and the second semiconductor body are bonded to the silicon on insulator body to form a vacuum-sealed structure containing the sensing elements. However, the first/second semiconductor bodies may be bonded to the silicon on insulator body in any way, for example, by glass frit, soldering, gluing and so on.

In an embodiment, the silicon on insulator body comprises an absorption layer for absorbing the infrared radiations. However, the absorption layer may have any size, shape and it may be of any material.

In an embodiment, the second semiconductor body comprises a vacuum getter for improving a vacuum of the vacuum-sealed structure. However, the vacuum getter may have any size, shape and it may be of any material.

An embodiment provides a thermographic device comprising the thermographic sensor of above for providing one or more electrical signals indicative of the thermal radiation based on the sensing voltages. However, the electrical signals may be of any type, for example, voltages, currents and so on, and in any number, for example, an electrical signal for each sensing element, a common electrical signal for all the sensing elements and so on.

In an embodiment, the thermographic device comprises a signal processing circuit that is coupled with the thermographic sensor for processing the electrical signals. However, the signal processing circuit may apply any number and type of processing operations (for example, partial, different and additional processing operations with respect to the ones mentioned above); moreover, the signal processing circuit may be of any type, for example, integrated on a separate body of any type, either the same or different with respect to the one of the thermographic sensor, together with the thermographic sensor in the same body, and so on, with the thermographic sensor and the processing circuit that may be coupled in any way, for example, in a common package, a common chip, on a PCB and so on.

An embodiment provides a system comprising at least one thermographic device of above. However, the system may comprise any number of thermographic devices and it may be of any type, for example, for ensuring social distancing, controlling air conditioners, monitoring food transportations, detecting hot spots, assisting people, controlling accesses and so on.

Generally, similar considerations apply if the thermographic sensor, the thermographic device and the system each has a different structure or comprises equivalent components, for example, of different materials, or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

A thermographic sensor (105) for sensing a thermal radiation, wherein the thermographic sensor (105) may be summarized as including a plurality of sensing elements (205) each including at least one thermo-couple (TP) having a hot joint (H) and a cold joint (P-N) for providing a sensing voltage depending on a difference between a temperature of the hot joint (H) and a temperature of the cold joint (P-N), wherein the thermographic sensor (105) is integrated on a semiconductor on insulator body (210) including a substrate (305), a functional layer (310) and an insulating layer (315) interposed between the substrate (305) and the functional layer (310), the body (210) being patterned to define a grid (320) of the functional layer (310) and the insulating layer (315) suspended from the substrate (305), for each of the sensing elements (205) the grid (315) including a frame (325), a plate (330) and one or more arms (335a,335b) sustaining the plate (330) from the frame (325), with the corresponding thermo-couple (TC) having a first conductor (340p) of a first electrically conductive material extending from a first sensing terminal (P) of the cold joint (P-N) in the frame (325) to the plate (330) through one of the arms (335a) and a second conductor (340n) of a second electrically conductive material, different from the first electrically conductive material, extending from a second sensing terminal (N) of the cold joint (P-N) in the frame (325) to the plate (330) through one of the arms (335b), the first conductor (340p) and the second conductor (340n) being short-circuited at the plate (330) into the hot joint (H), and wherein the frames (330) include one or more conductive layers (350) of thermally conductive material for thermally equalizing the cold joints (P-N) with the substrate (305).

Each of the sensing elements (205) may include a processing circuit (355) for the thermo-couple (TC), the processing circuit (355) being integrated on the corresponding frame (325).

The processing circuit (355) may include a pre-amplification circuit (Mp) for pre-amplifying the sensing voltage provided by the thermo-couple (TC).

The processing circuit (355) may include a selection circuit (Ms) for selecting the sensing element (205).

For each sensing element (205) the pre-amplification circuit (Mp) may include a pre-amplification transistor (Mp) having a control terminal (Pg), a first conduction terminal (Ts) and a second conduction terminal (Td), the control terminal (Pg) of the pre-amplification transistor (Mp) being coupled with the first sensing terminal (P) of the thermo-couple (P-N), and the selection circuit (Ms) may include a selection transistor (Ms) having a control terminal (Sg), a first conduction terminal (Ss) and second conduction terminal (Sd), the first conduction terminal (Ss) of the selection transistor (Ms) being coupled with the second conduction terminal (Pd) of the pre-amplification transistor (Mp).

The sensing elements (305) may be arranged in an array with a plurality of rows and a plurality of columns, the thermographic sensor (105) including corresponding column selection lines (SLc) coupled with the control terminals (Sg) of the selection transistors (Ms) of the columns, corresponding row selection lines (SLr) coupled with the first conduction terminals (Ps) of the pre-amplification transistors (Mp) of the rows, and corresponding sensing lines (RL) coupled with the second conduction terminals (Sd) of the selection transistors (Ms) of the columns.

The thermographic sensor (105) may include a first semiconductor body (215), having a cavity (220) corresponding to a further cavity (240) of the silicon on insulator body (210) at the grid (320), and a second semiconductor body (235), the first semiconductor body (215) and the second semiconductor body (235) being bonded to the silicon on insulator body (210) to form a vacuum-sealed structure (220,240) containing the sensing elements (205).

The silicon on insulator body (210) may include an absorption layer (245) for absorbing the infrared radiations and/or wherein the second semiconductor body (235) may include a vacuum getter (250) for improving a vacuum of the vacuum-sealed structure (220,240).

A thermographic device (100) may be summarized as including the thermographic sensor (105) for providing one or more electrical signals indicative of the thermal radiation based on the sensing voltages, and a signal processing circuit (110) being coupled with the thermographic sensor (105) for processing the electrical signals.

A system (500) may be summarized as including at least one thermographic device (100).

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thermographic sensor for sensing a thermal radiation, the thermographic sensor including a plurality of sensing elements each comprising:
a semiconductor on insulator body including a substrate;
a functional layer and an insulating layer interposed between the substrate and the functional layer, the functional layer and the insulating layer including one or more grids, a grid of the functional layer and the insulating layer suspended from the substrate, the grid including:
a frame, a plate and one or more arms sustaining the plate from the frame, the frame including one or more conductive layers of a thermally conductive material; and
a thermo-couple having a hot joint and a cold joint in the grid, the thermo-couple configured to provide a sensing voltage based on a difference between a temperature of the hot joint and a temperature of the cold joint, the cold joint including a first sensing terminal and a second sensing terminal, the thermo-couple having a first conductor of a first electrically conductive material extending from the first sensing terminal of the cold joint in the frame to the plate through one of the arms and a second conductor of a second electrically conductive material, different from the first electrically conductive material, extending from the second sensing terminal of the cold joint in the frame to the plate through one of the arms, the first conductor and the second conductor being short-circuited at the plate into the hot joint.

2. The thermographic sensor according to claim 1, wherein each of the sensing elements comprises a processing circuit for the thermo-couple, the processing circuit being integrated on a corresponding frame.

3. The thermographic sensor according to claim 2, wherein the processing circuit comprises a pre-amplification circuit for pre-amplifying the sensing voltage provided by the thermo-couple.

4. The thermographic sensor according to claim 2, wherein the processing circuit comprises a selection circuit for selecting the sensing element.

5. The thermographic sensor according to claim 4, wherein for each sensing element the pre-amplification circuit comprises a pre-amplification transistor having a control terminal, a first conduction terminal and a second conduction terminal, the control terminal of the pre-amplification transistor being coupled with the first sensing terminal of the thermo-couple, and wherein the selection circuit comprises a selection transistor having a control terminal, a first conduction terminal and second conduction terminal, the first conduction terminal of the selection transistor being coupled with the second conduction terminal of the pre-amplification transistor.

6. The thermographic sensor according to claim 5, wherein the sensing elements are arranged in an array with a plurality of rows and a plurality of columns, the thermographic sensor comprising corresponding column selection lines coupled with the control terminals of the selection transistors of the columns, corresponding row selection lines coupled with the first conduction terminals of the pre-amplification transistors of the rows, and corresponding sensing lines coupled with the second conduction terminals of the selection transistors of the columns.

7. The thermographic sensor according to claim 1, wherein the thermographic sensor comprises a first semiconductor body and a second semiconductor body, the first semiconductor body includes a first cavity, the semiconductor on insulator body at the grid includes a second cavity, the first cavity corresponding to the second cavity, the first semiconductor body and the second semiconductor body being bonded to the semiconductor on insulator body to form a vacuum-sealed structure containing the plurality of sensing elements.

8. The thermographic sensor according to claim 7, wherein the semiconductor on insulator body comprises an absorption layer for absorbing infrared radiations.

9. The thermographic sensor according to claim 7, wherein the second semiconductor body comprises a vacuum getter for improving a vacuum of the vacuum-sealed structure.

10. The thermographic sensor according to claim 1, wherein the one or more conductive layers of the frames thermally equalize the cold joint with the substrate.

11. A sensor, comprising:
a first body including a membrane on a first surface of the first body and a first cavity in the first body and below the membrane, the membrane including a frame portion, a plate portion, a first arm portion coupling the plate portion to the frame portion, and a first conductive track extending from a first point on the frame portion to a second point on the plate portion through the first arm portion;
a second body coupled to the first body by the first surface of the first body, the second body having a second cavity facing the membrane; and
a third body coupled to the first body by a second surface of the first body, the second surface opposite to the first surface.

12. The sensor according to claim 11, wherein the first cavity extends into the third body.

13. The sensor according to claim 11, comprising a getter film on the first cavity.

14. The sensor according to claim 11, comprising an absorption layer on the membrane.

15. The sensor according to claim 11, wherein the first body includes a second arm portion coupling the plate portion to the frame portion and a second conductive track extending from a third point on the frame portion to the second point on the plate portion through the second arm portion.

16. The sensor according to claim 15, wherein the first conductive track and the second conductive track form a P-N junction.

17. The sensor according to claim 16, wherein the first conductive track includes P+ polysilicon and the second conductive track includes N+ polysilicon.

18. A thermographic device comprising:
- a thermographic sensor configured to provide an electrical signal indicative of thermal radiation; and
- a signal processing circuit being coupled with the thermographic sensor configured to process the electrical signal, wherein the thermographic sensor includes:
- a first body including a membrane on a first surface of the first body and a first cavity in the first body and below the membrane, the membrane including a frame portion, a plate portion, a first arm portion coupling the plate portion to the frame portion, and a first conductive track extending from a first point on the frame portion to a second point on the plate portion through the first arm portion; and
- a second body coupled to the first body by the first surface of the first body, the second body having a second cavity facing the membrane.

19. The device according to claim 18, wherein the first body includes a second arm portion coupling the plate portion to the frame portion and a second conductive track extending from a third point on the frame portion to the second point on the plate portion through the second arm portion.

20. The device according to claim 19, wherein the first conductive track and the second conductive track form a P-N junction.

* * * * *